[12] United States Patent
Kavipurapu et al.

(10) Patent No.: US 7,439,763 B1
(45) Date of Patent: Oct. 21, 2008

(54) SCALABLE SHARED NETWORK MEMORY SWITCH FOR AN FPGA

(75) Inventors: Gautam Nag Kavipurapu, Sunnyvale, CA (US); Sweatha Rao, San Jose, CA (US); Chris Althouse, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 118 days.

(21) Appl. No.: 11/258,685

(22) Filed: Oct. 25, 2005

(51) Int. Cl.
*G06F 7/38* (2006.01)
*H03K 19/173* (2006.01)
(52) U.S. Cl. .............................. 326/38; 326/39; 326/40
(58) Field of Classification Search .............. 326/38–41
See application file for complete search history.

(56) References Cited

U.S. PATENT DOCUMENTS

| | | | |
|---|---|---|---|
| 5,166,927 A | 11/1992 | Iida et al. | |
| 5,469,003 A | 11/1995 | Kean | |
| 5,606,562 A | 2/1997 | Landguth | |
| 5,610,914 A | 3/1997 | Yamada | |
| 5,841,771 A * | 11/1998 | Irwin et al. | 370/360 |
| 5,953,336 A | 9/1999 | Moore et al. | |
| 6,160,813 A | 12/2000 | Banks et al. | |
| 6,480,911 B1 | 11/2002 | Lu | |
| 6,546,017 B1 * | 4/2003 | Khaunte | |

OTHER PUBLICATIONS

Nikologiannis, A.; Katevenis, M., "Efficient per-flow queueing in DRAM at OC-192 line rate using out-of-order execution techniques"; Communications, 2001. ICC 2001. IEEE International Conference on vol. 7, Jun. 11-14, 2001 pp. 2048-2052 vol. 7 Digital Object Identifier 10. 1109/ICC.2001.937019.
Sundar Iyer, Amr Awadallah, Nick McKeown, "Analysis of a packet switch with memories running slower than the line-rate," Stanford university computer system laboratory, May 2000., 1-47 pgs.
Amit Prakash, Sadia Sharif, Adnan Aziz, "An O(log2N) parallel algorithm for out put queuing," University of Texas at Austin, 2002, 0-7803-7476-Feb. 02, 2002 IEEE, 7 pgs.

(Continued)

*Primary Examiner*—Anh Q Tran
(74) *Attorney, Agent, or Firm*—Thomas A. Ward

(57) ABSTRACT

A shared memory switch is provided for storing and retrieving data from BlockRAM (BRAM) memory of a PLD. A set of class queues maintain a group of pointers that show the location of the incoming "cells" or "packets" stored in the memory in the switch based on the time of storage in the BRAM. A non-blocking memory architecture is implemented that allows for a scalable N×N memory structure to be created (N=number of input and output ports). A write controller stripes the data across this N×N memory to prevent data collisions on read in or read out of data. The data is scheduled for read out of this N×N shared memory buffer based on priorities or classes in the class queues, with priorities being set by a user, and then data is read out from the BRAM.

15 Claims, 7 Drawing Sheets

OTHER PUBLICATIONS

Biplab Sikdar et al., "An Integrated Model For the Latency and Steady-State Throughtout of TCP Connections", Dept. of Electrical Computer Science Engineering, Rensselaer Polytechnic Institute, Performance Evaluation, vol. 46, no. 2-3 pgs. 139-154, Oct. 2001. (ABSTRACT).

Mutlu Arpaci, John Copeland, "Buffer Management for Shared Memory ATM Switches", IEEE Communication Surveys, http://www.comsoc.org/pubs/surveys, First Quarter 2000, 1-10 pgs.

Andreas Frey, Yoshita Takahashi, "A note on an M/G1/1/N queue with vacation time and exhaustive serivce discipline," Ntt Multimedia Network Laboratories.

Manjunath, D.; Sikdar, B.; "Variabel Length Packet Switches: Delay Analysis of Crossbar Switches under Poisson and Self Similar Traffic", INFOCOM 2000. 19th Annual Joint Conference of the IEEE Computer and Communications Societies. Proceedings. IEEE vol. 2, Mar. 26-30, 2000 pp. 1055-1064 vol. 2 Digital Object Identifier 10.1109/INFCOM.2000.832281.

11/259,394, filed Oct. 25, 2005, Kavipurapu G. N. et al., entitled "Time Based Data Storage for shared Network Memory Switch", 23 pgs., XILINX, Inc. 2100 Logic Drive, San Jose California, 95124.

11/258,683, filed Oct. 25, 2005, Kavipurapu G. N. et al., entitled "Striping of Data into Memory of a Network Data Switch to Prevent Read and Write Collisions", 24 pgs., XILINX, Inc. 2100 Logic Drive, San Jose California, 95124.

11/258,682, filed Oct. 25, 2005, Kavipurapu G. N. et al., entitled "Class Queue for Network Data Switch to Identify Data Memory Locations by Arrival Time", 23 pgs., XILINX, Inc. 2100 Logic Drive, San Jose California, 95124.

Massiglia, Paul, The RAID Book, RAID Advisory Board, 6th Edition, Chapter 4: Disk Striping and Mirroring, Feb., 1997, pp. 84-85.

* cited by examiner

FIG. 6

FIG. 7 class 1 class 2 class 3 class 4

$t_4$  $t_3$  $t_2$  $t_1$  $t_0$

SCALABLE SHARED NETWORK MEMORY SWITCH FOR AN FPGA

BACKGROUND

1. Technical Field

The present invention relates to a network switch providing communication between nodes that uses a BlockRAM (BRAM) memory of a Field Programmable Gate Array (FPGA) to store data.

2. Related Art

Traditional switching functions in network systems require the interconnection of various nodes, or modules that perform a specific function. Nodes can be formed on a single device, such as an Application Specific Integrated Circuit (ASIC), or multiple chips, with the nodes configured to communicate with one another. Communications are accomplished using direct communication links between the nodes over a circuit switched crossbar, or by using a bus structure.

The crossbar switch provides a set of connecting wires, with no support for the data formats that are transmitted between nodes or modules formed in the logic. The crossbar connection scheme while providing extremely low latency for traversal times between the nodes provides no support to the packets or cells or other types of data bursts that form the data interchange format between the nodes.

To support packet or cell data formats, cells or packets buffers can be provided at the input or output ports of the switch. The buffers then function to switch the packet or cell information packet or cell at a time. More sophisticated ASICs provide for switching of cell or packet data between nodes using busses, but they provide switching tailored for use in systems that use specific protocols such as Ethernet, Internet Protocol Version 4 and 6 (IPv4 and IPv6), PCI Express, Rapid I/O, Infiniband, etc. with support for cells/packets/data-grams or other types of data bursts associated with the respective protocols. A PCI express switch will not support other protocols or standards when it is supplied in an ASIC.

Programmable logic devices PLDs, such as Field Programmable Gate Arrays (FPGAs), allow for programming of multiple nodes within a single device with circuitry further programmed to provide for communication between the nodes. Communication between nodes is typically provided using a crossbar switch programmed using interconnect logic of the FPGA. Communication between nodes, however, can also be provided using a bus structure and data buffering using a memory. The memory device is typically used to store packets of data while the data is buffered and transferred between nodes. Programming the memory and scheduler for writing data to and reading data from the memory being transferred between nodes, however, uses a significant amount of logic available on the FPGA. Significantly more logic must be made available with a network data switch on an FPGA to accommodate a selection between all different types of data protocols a programmer might wish to use. Limited memory is available on the FPGA for storing data long term.

It would be desirable to provide a communication system for interconnecting nodes on an FPGA that can adapt to different communication protocols. It would further be desirable to provide such a communication systems that use minimal logic resources of the FPGA, leaving logic available for programming additional nodes.

SUMMARY

Embodiments of the present invention provide a protocol agnostic cell based switch for communication between nodes of an FPGA. The switch can be used in conjunction with specific physical layer interfaces to implement switching interconnects between network nodes that support many different communication protocols, agnostic indicating that the protocol may be unknown and may or may not be a standard like Ethernet. Putting such a switch in an FPGA provides the user flexibility in terms of performance, tuning and customizable features of the design that are not available in ASIC devices.

The shared memory switch provided stores and retrieves data from the Block Random Access Memories (BRAMs) of an FPGA. The switch contains a set of input ports and output ports through which data can be sent and received. A scalable memory architecture is implemented allowing programmable scaling of the BRAM into an N×N memory structure, where N=number of input and output ports selected. Embodiments of the present invention use a very small amount of memory (BRAMs), even with programmable scaling, the memory size required having a linear dependence on the FPGA resources. In addition to BRAM, the switch architecture allows for linear scaling of other FPGA resources, such as shift register latches (SRLs) based on the number of ports selected. For example, resource usage=f(N) where f(N) is a simple linear function of N, N indicating the number of parts on the switch. The switch can further have parametrizable port data-paths (i.e., 16, 32, 64 bits) with a physical layer bus interface going into and out of every port.

The scalable memory is implemented by pipelining data and storing data pointers that identify BRAM storage locations for data in the N×N memory based on write time, rather than addressing. Pipelining and the elimination of addressing further provides a guaranteed latency for traffic (packets/cells) going from the input ports to the output ports of the network switch. Pipelining is further aided by a non-blocking write and read procedure.

A data write controller for writing data into a cell buffer for the memory stripes the data across segments of the memory to prevent data collisions on read in and read out of data. The memory is divided into a number of segments that corresponds in a linear fashion with the number of input and output ports. In one embodiment, 2N segments are provided for the N×N memory. Data packets or cells received are divided into bytes and then written or stripped into segments of the buffer memory so that successive bytes are not stored in the same segment column for a number of time periods to prevent collisions on data read out.

A set of class queues maintain a group of pointers that show the location of the incoming "cells" or "packets" stored in the memory in the switch based on the time of storage in the BRAM without requiring use of addresses or a link list. Data pointers are stored in separate queues according to class, and according to their storage time. To identify the storage time of the data pointers, null pointers are stored when no data is received for the class during a time period. On writing of data to be stored, if a cell header shows an error during a cyclic redundancy check (CRC), then the data is discarded and a null pointer is stored in each class queue. This prevents data blocking to maintain the data pipeline without interruption, and does not require memory addresses to be reset using a memory consuming address link list.

The network switch contains a modular scheduling block that can be replaced without affecting other modules in the design to change the scheduling schemes. The data stored in BRAM is scheduled for read out of this N×N shared memory buffer based on priorities or classes in the class queues, with priorities being set by a user. Identification of the data to be read out is then provided from the scheduler to a read controller to effect readout of data. The cache queue, scheduler and read controller, thus operate independently.

BRIEF DESCRIPTION OF THE DRAWINGS

Further details of the present invention are explained with the help of the attached drawings in which:

FIGS. 6-7 illustrate additional methods for striping data into memory ports;

DETAILED DESCRIPTION

Embodiments of the present invention are described for use in an FPGA. The network switch according to the present invention provides for communications between nodes or modules programmed into the logic of an FPGA. The network switch is also programmed into the logic. Further, the FPGA memory can be configured to meet the parameters defined for the switch. Although the following description of embodiments of the present invention are described with respect to particular components of an FPGA, it is understood that other integrated circuits with on board programmable logic and memory can be programmed to include a network switch according to embodiments of the present invention. For reference, FIG. 1 shows one configuration of components of an FPGA that can be configured to include a network switch according to the present invention.

FPGA Overview

Figure 1:
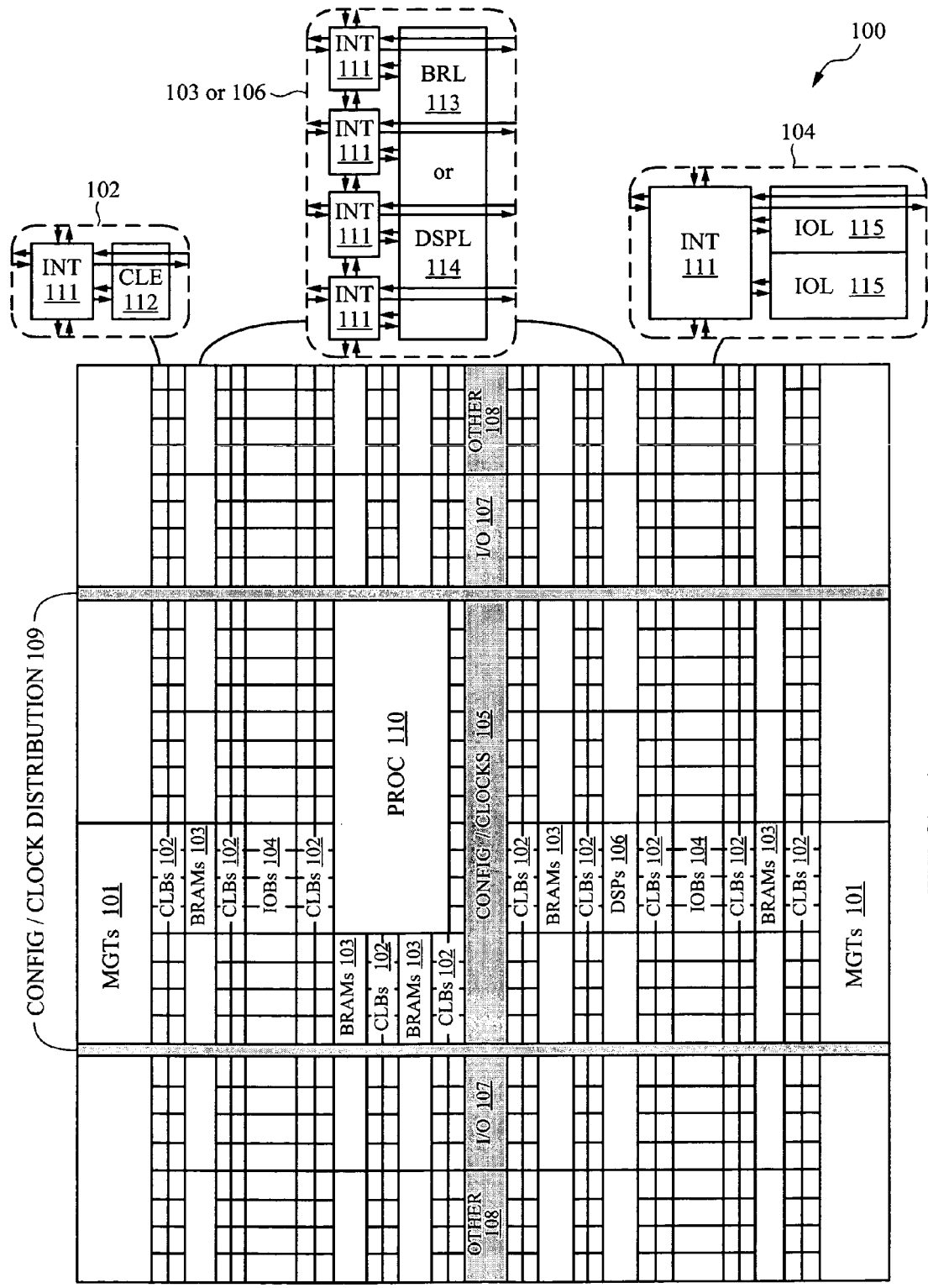
FIG. 1 shows components of a field programmable gate array (FPGA)

The FPGA of FIG. 1 includes a large number of different programmable tiles including MGTs 101, configurable logic blocks (CLBs 102), BRAMs 103, input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. The FPGA can also include a dedicated processor blocks (PROC 110).

Each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 2.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Network Switch Architecture Overview

Figure 2:
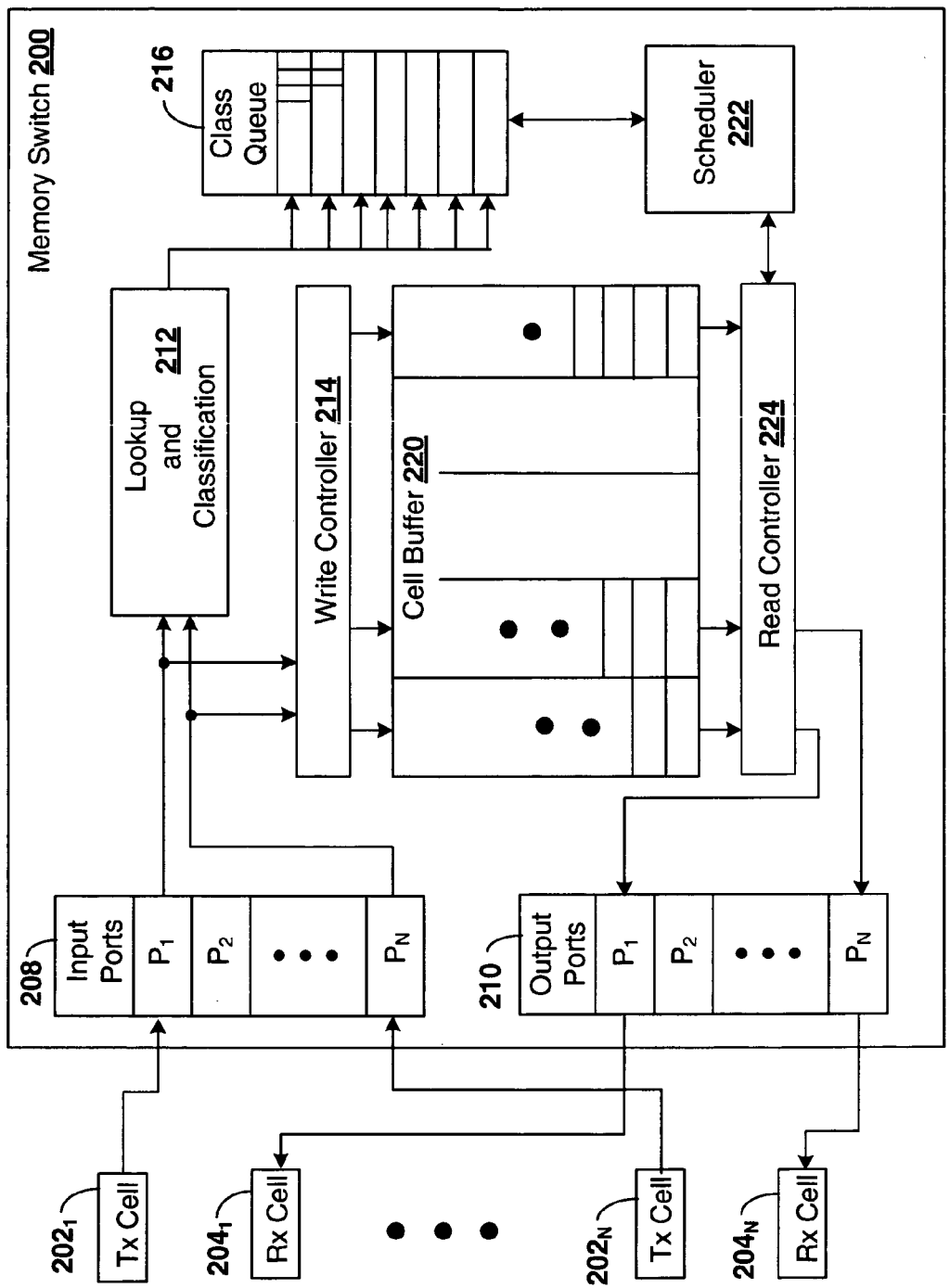
FIG. 2 shows a block diagram of components of a memory switch constructed in an FPGA according to embodiments of the present invention.

FIG. 2 shows a block diagram of components of a memory switch 200 constructed in an FPGA according to embodiments of the present invention. The memory switch 200 provides for communication between transmit cells $202_{1-N}$ (Tx Cell) and receive cells $204_{1-N}$ (Rx Cell). The cells are formed by the transmitters and receivers in nodes or modules programmed into the FPGA. The transmitter of one node communicates by sending data in the form of packets, cells or data-grams through the network switch 200 to a receiver of another node.

Data from the transmit cells $202_{1-N}$ are provided to input ports 208 of the network switch 200, while data is directed from the output ports 210 of the network switch to receive cells $204_{1-N}$. The transmit cells and receives cells can be connected to the ports of the network switch 200 either directly using a crossbar connection configuration, or connected through a bus to the ports 208 of the switch. The network switch architecture according to the present invention allows the number of input ports and output ports to be scalable by programming the FPGA resources to form an N×N port memory, where N is an integer. The size N×N of the network switch can be chosen depending on design requirements to optimize the tradeoff between operation speed and use of the FPGA resources.

Data from the input ports 208 are provided to a lookup and classification module 212 as well as to a write controller 214.

The lookup and classification module 212 removes the header from the packet of data, and does necessary error correction checking such as a cyclic redundancy check. From the header information, the lookup and classification module 212 further generates a pointer to identify the storage location in a cell buffer 220 where the packet will be stored. The pointer and classification information is then passed on to the class queue 216.

The write controller 214 operates to write or stripe data in a defined manner into memory sections that are provided in a cell buffer 220. The write controller 214 breaks up the packets of data into individual bytes, the size of the data bytes depending on how the cell buffer 220 is divided up. The write controller 214 stripes the individual bytes in locations of the cell buffer 220 in multiple access segments of the cell buffer 220 in a manner to avoid data collisions on read in as well as read out. More details of pointer generation and striping of data are described subsequently.

The cell buffer 220 is formed using BRAM memory devices of the FPGA. The cell buffer 220 is formed by subdividing the BRAM memory into input sections. In one embodiment, the number of input sections, or columns, of the BRAM is set as a multiple of the number of input and output ports N. For example, the number of memory sections may be 2N, for the N×N port memory switch.

Class queue 216 helps manage or locate data stored in the cell buffer 220 based on the storage of pointers. The pointers are stored in a timed manner to eliminate the need for addressing of data stored. Timed storage of pointers also eliminates the need for link lists that are typically used to address groups of pointers within the class queue. Elimination of addressing eliminates the need for logic from the FPGA that will be used for decoding of address information. Addressing logic and link lists can use up to 90% of the available logic in an FPGA just to make a memory switch. Elimination of addressing can further reduce the amount of memory space required for storage of the class queue information.

The class queue 216 also maintains a priority for the data stored in the cell buffer 220 based on an ordering of pointers. The class queue 216 includes a number of rows for storage of pointers. Each row of the class queue 216 corresponds to a class of data. Data pointers are then stored in rows of the class queue 216 according to class. Further details of the class queue are described subsequently.

A scheduler 222 determines the order for readout of data. The scheduler 222 can be selected according to user needs. For example, the scheduler 222 can be a round-robin type, a first-in-first-out type, or other type known in the art. The scheduler 222 determines the next class of data to be read out and with the selection obtains one or more pointers from the class queue 216. The scheduler 222 then passes the pointers obtained from the class queue 216 to a read controller 224 for readout of the cell buffer 220. The scheduler 222, otherwise, operates independent from the read controller 224.

The read controller 224 reads or un-stripes the data from the cell buffer. The read controller uses the pointer information passed from the class queue 216 by the scheduler 222 to determine from which ports to read the data. The data once read out and concatenated back together in packet form is provided to an output port 210 identified by the one or more pointers. From the data output port 210, the data packets are the provided to the appropriate one of the receive cells $204_{1-N}$.

Pipelining and Storage Timing

Figure 3:
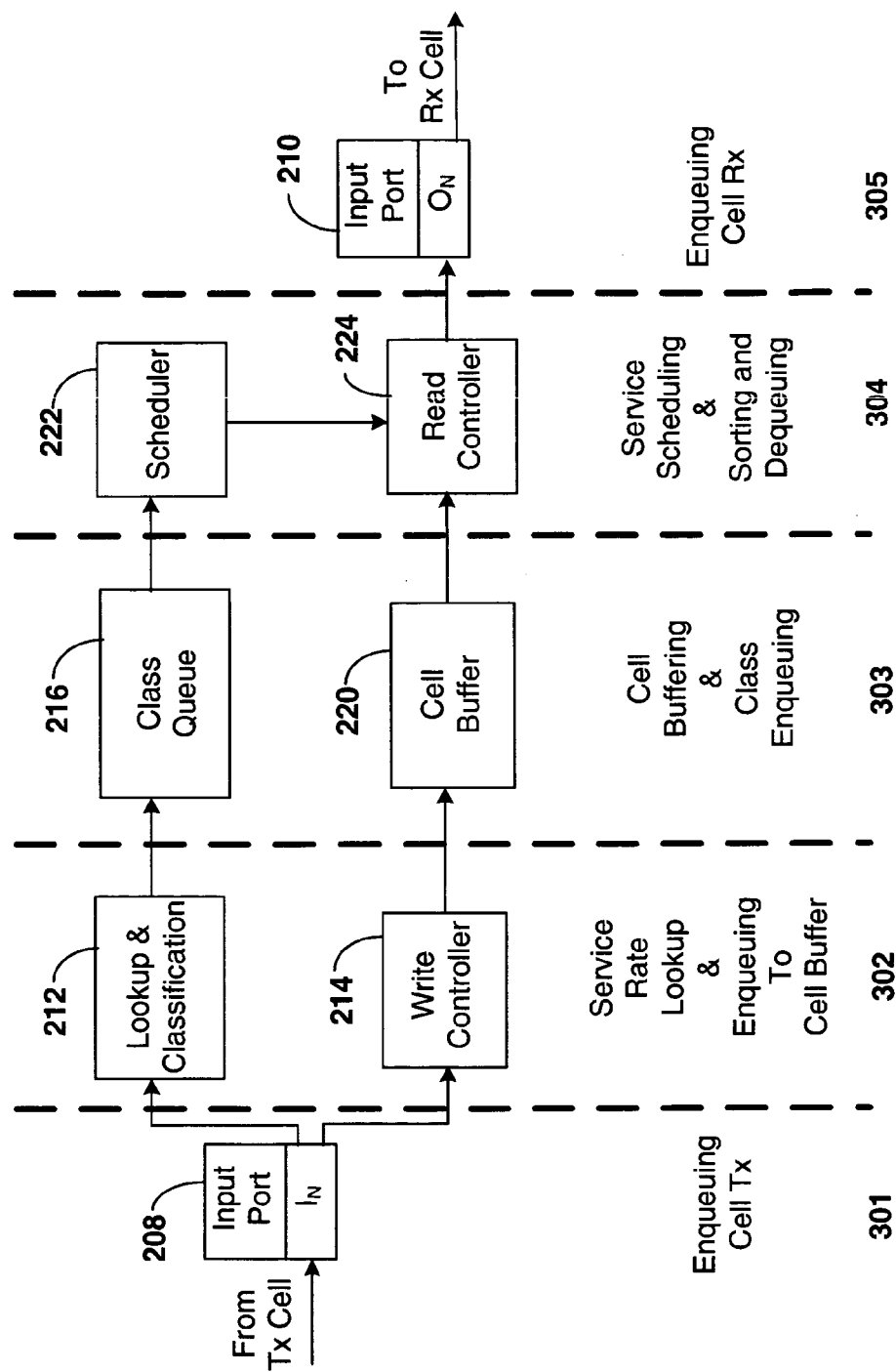
FIG. 3 illustrates a pipeline structure established using the memory switch of FIG. 2.

FIG. 3 illustrates a pipeline structure established using the memory switch of FIG. 2. Pipelining of the data enables a timed data storage used by embodiments of the present invention, as opposed to addressing. Clock cycles from arrival of data at the input ports 208 are used to determine how the write controller 214 does striping as well as how the class queue 216 locates data pointers. Pipelining also enables buffering of data so that required memory space for data storage is minimized. Data is effectively buffered in the pipeline steps separate from the cell buffer 220

Pipelining also provides a guaranteed latency for data to travel through the network switch. The switch on a cell-by-cell basis provides upper and lower bounds on the latency through the pipeline. In one embodiment, state machines running in modules of the network switch at every stage in the pipeline provide their state information to a central state register (not shown in FIGS. 2-3). The sum-total of all the states forms the state of the switch and also provides information as to which stage in the pipeline a cell is passing through or is in at any given instant.

As illustrated in FIG. 3, the pipeline begins with pipeline step 301 with transmission of cells from one of the transmitters into an input port 208 of the network switch 200. In step 302, data in the form of packets or cells is provided from the input port 202 to both the look up and classification module 212 and write controller 214. As indicated above, during step 302 the lookup and classification module 212 removes the packet header, determines a class, does error checking, and prepares pointer information for the class queue 216. The write controller 214 during step 302 subdivides the data packets into defined bytes and stripes data into individual input sections of the cell buffer 220. In step 303 pointers are stored in appropriate locations in the class queue 216, and data bytes are stored into individual sections of the cell buffer 220. In step 304 the scheduler 222 determines next data to be read out and provides the appropriate pointers from the class queue 216 to the read controller 224 for locating data to read out of memory. In step 305, the read controller 224 passes the data from the cell buffer 220 to an output port 210 of the network switch 200. In one embodiment, two bytes are transferred in each pipeline state per clock cycle, and two bytes of data will take 32 clock cycles to transfer through the pipeline.

Data Striping

Figure 4:
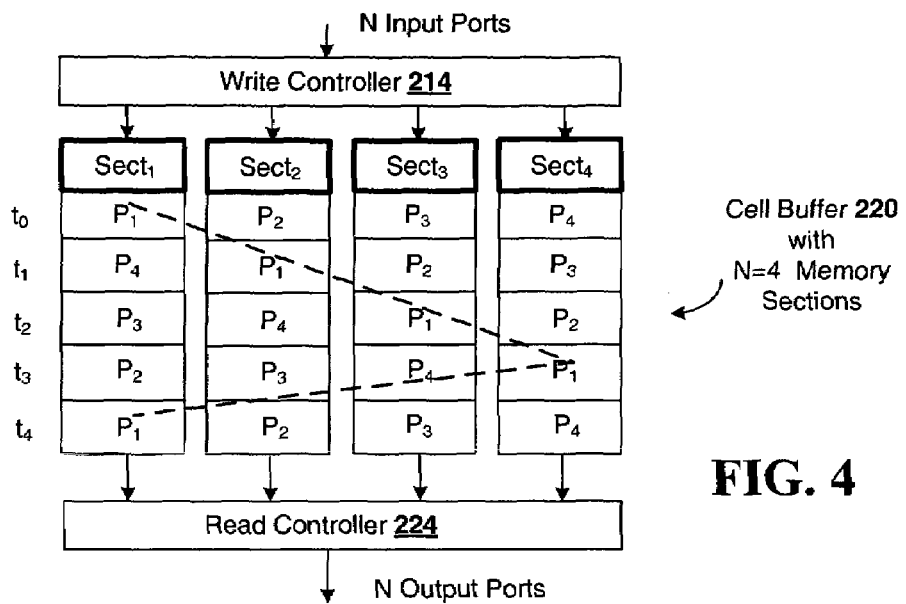
FIGS. 4-5 illustrates methods for striping data into memory ports.

FIG. 4 illustrates a method for striping data into memory ports according to some embodiments of the present invention. FIG. 4 shows one example of how the cell buffer 220 can be divided up into sections, labeled $Sect_{1-4}$. In FIG. 4, the number of input ports N=4 is the same as the number of sections $Sect_{1-4}$. To avoid data collisions, however, the number of sections $Sect_{1-4}$ may need to be an integral multiple of the number of ports N.

Data from the input ports are divided up into bytes, labeled $P_{1-4}$ for storage in the rows of the memory sections $Sect_{1-4}$ from the write controller 214. The byte sections stored in the memory sections $Sect_{1-4}$ are then concatenated back together on readout by the read controller 224 for sending to the output ports.

The word received at an input port for breaking up in the write controller 214 will be subdivided into an integral multiple of the total number of bytes of the word for storage in sections $Sect_{1-4}$. For example, if the total word received at a port is 4 bytes, and each word is subdivided for storage in a section to 2 byte units, then each stored element $P_{1-4}$ will be 2 bytes. With bytes stored being ½ the total word received at a port, the effective dequeuing rate can be twice that of the enqueuing rate of the system. In this one example, the internal clock frequency of the cell buffer can be twice that of the system clock. If, however, the number of input ports and the number of cell buffer sections match, as with the case shown in FIG. 4, then no difference from input buffer pipeline cycles will be required.

The write controller 214 controls data striping to align the data bytes across the sections $Sect_{1-4}$ of the dual port memories making up the cell buffer 220. The write controller 214 functions as a circular shifter that can implement a left shift or a right shift depending on the striping scheme desired. FIG. 4 illustrates a right shift scheme. The striping scheme can be described with reference to FIG. 4 by observing the alignment of the data portions $P_{1-4}$ from the input ports with the sections $Sect_{1-4}$ of the cell buffer 220 on a clock cycle basis. The dashed line illustrates how bytes from input port 1 are striped into the cell buffer 220 according to this striping scheme.

Assume a setup in an N port switch where N=4, as shown in FIG. 4, and that data is continually received at all ports at the same time at each clock cycle. At the start time, to, the input port 1 bytes ($P_1$) are aligned with memory section $Sect_1$, input port 2 bytes ($P_2$) are aligned with memory section $Sect_2$, and so forth. At time t1, input port 1 bytes ($P_1$) are aligned with memory section $Sect_2$, input port 2 bytes ($P_2$) are aligned with memory section $Sect_3$, and so forth. Looking at FIG. 4, one can see the alignment of the input port bytes $P_{14}$ to the memory sections every clock cycle by 1 to the right. This continues in a circular fashion with the write controller 214 striping the data from a cell across the sections of the cell buffer 220.

The cell buffer 220 internally is configured to take care of the start address of every stripe that starts every number of bit cycles that a cell or packet is broken into for storage. The number of bytes to a word stored is determined in one embodiment by the series to parallel conversion speed of the port transceiver. The network switch designer, however, can program to set the number of bytes stored in each cell buffer section.

The striping in a right or left shift manner is provided so that no cell buffer section will have consecutive column entries from the same port. Otherwise, readout collisions can occur. In fact, the right or left shifting will provide a number of column entries in a section before data from the same port packet will be stored again. In the configuration shown in FIG. 4, for example, with right shifting by 1 the memory section $Sect_1$ will only store bytes from port 1 ($P_1$) every four clock cycles.

Figure 5:
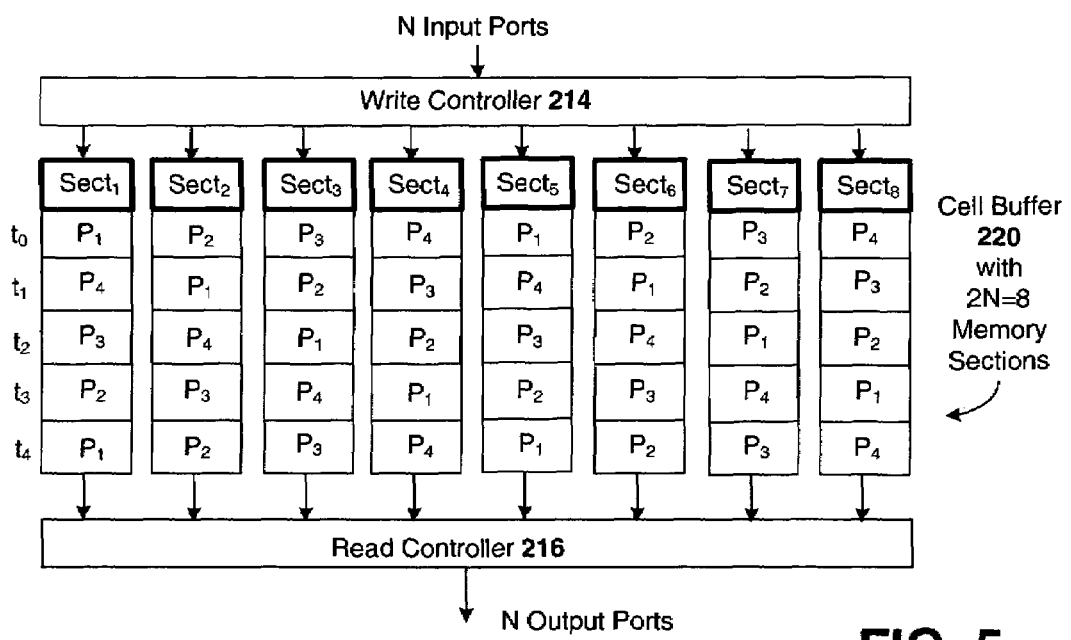

FIG. 5 illustrates how the number of cell buffer sections can be increased so that striping can further minimize readout collisions. In FIG. 5, the buffer memory 220 is subdivided into 2N, or 8 sections, where the number of ports N=4. With added sections or rows, collisions from one column will be less likely to occur. Although shown with 2N sections in FIG. 5, the number of sections can be expanded to 3N, 4N, and so forth depending on desired design requirements to reduce collisions.

Figures 6, 7:
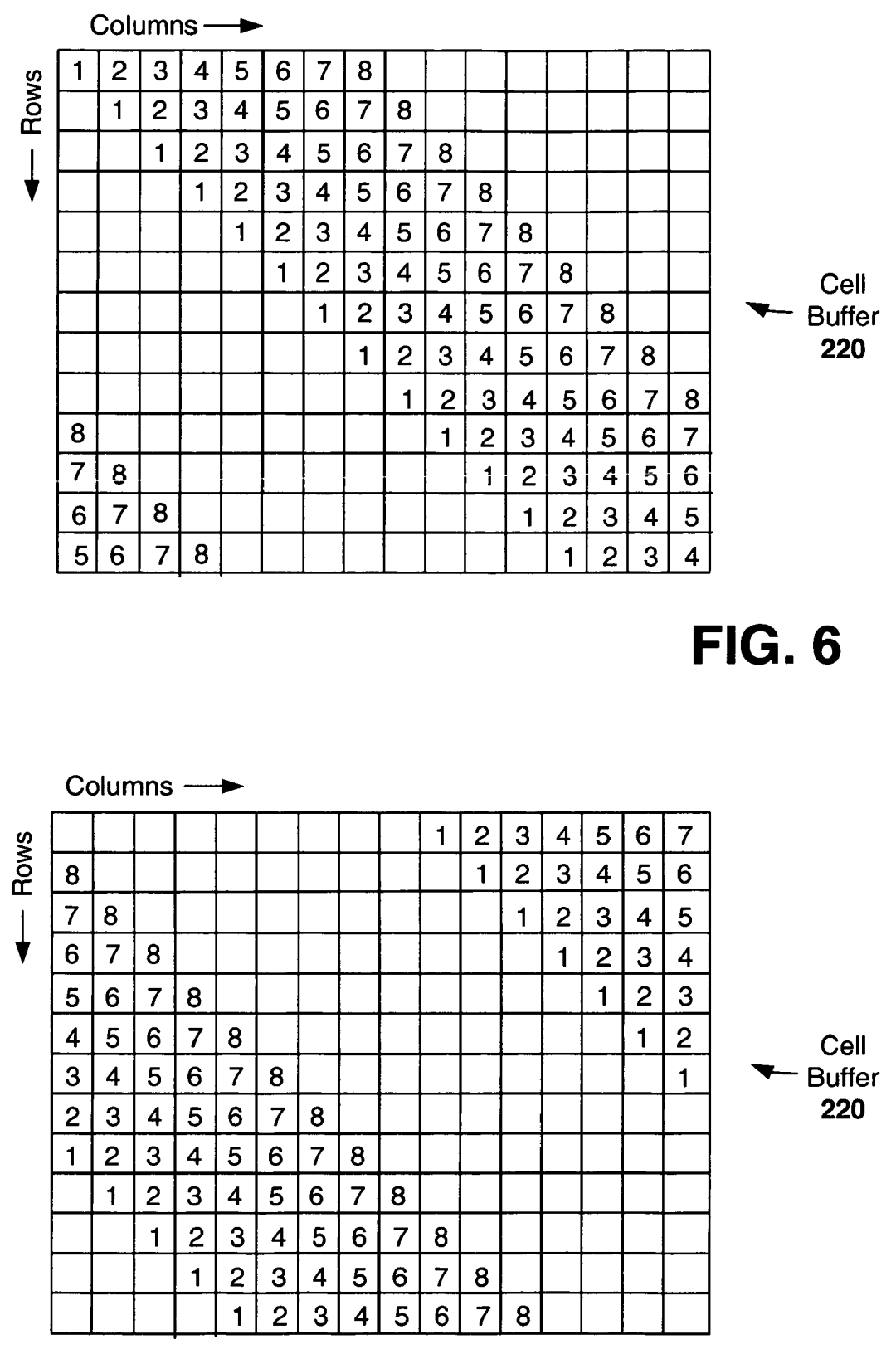

FIGS. 6 and 7 show an example of an alternative striping technique that can be used to store data segments in sections of the cell buffer 220 to minimize readout collisions. Data is provided in sections of the cell buffer 220 from N=8 different input ports, labeled 1-8. Successive port data is stored in consecutive column segments. A total of 2N columns are shown. After the last (or Nth) column segment is stored, N+1 null segments are stored in successive sections of the cell buffer 200 before data from the first port is again stored. Once the last column in a row is reached, data is simply wrapped around back to the first column of the next row. Although storage for N=8 ports are shown in FIGS. 6 and 7, with N+1 null pointers used between storage of point segments, it is understood that a different number of ports or null pointers between ports could be used depending on desired design requirements.

Class Queue Timing with Null Pointers

Figure 8:
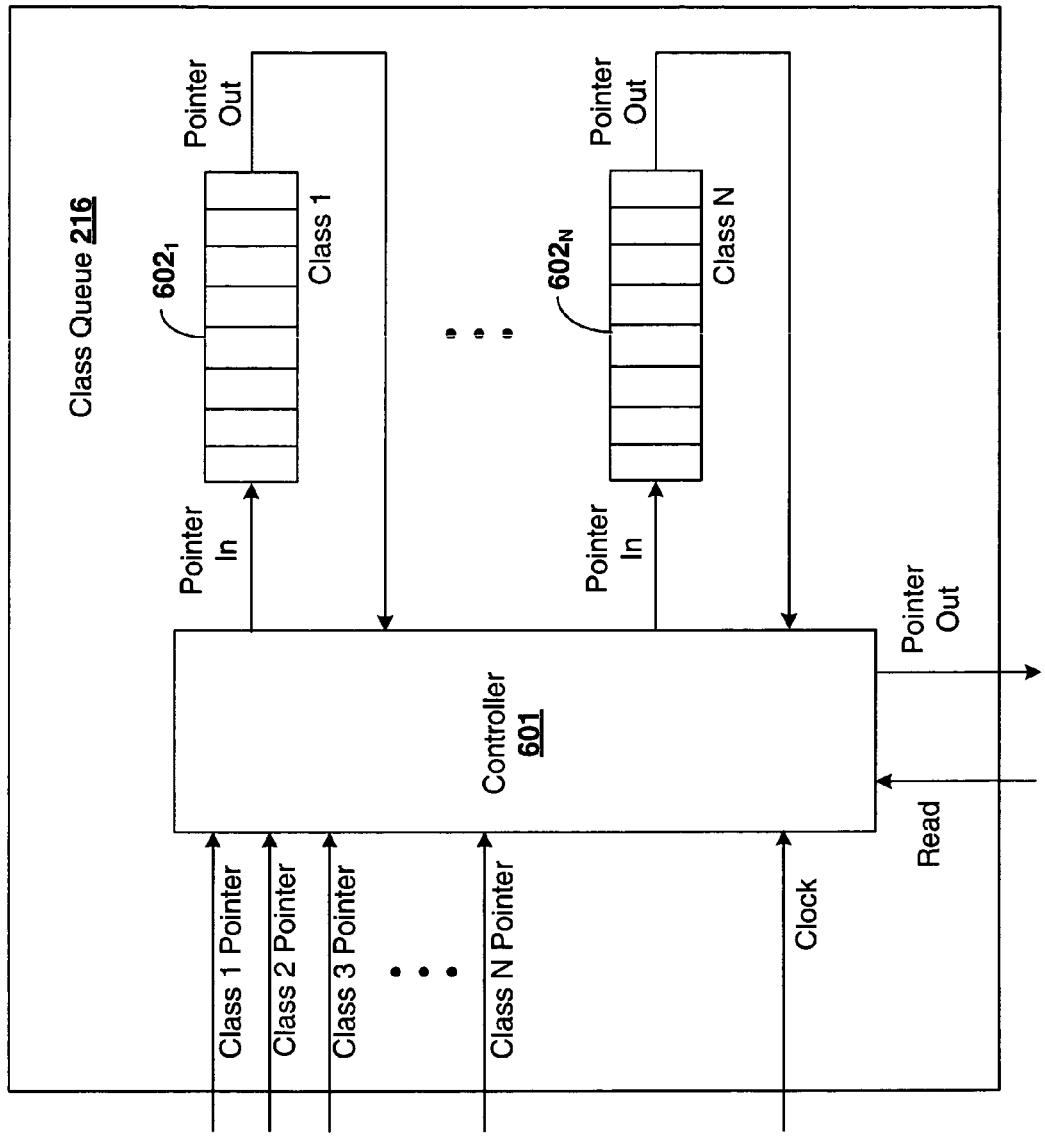
FIG. 8 provides a block diagram of components of the class queue.

FIG. 8 illustrates storage of data pointers into the class queue 216. The class queue 216 stores data pointers provided from the write controller 214. Data pointers are provided from the write controller 214 according to class to a controller 601 of the class queue 216, as shown. The controller then directs the pointers into the individual class queues $602_{1-N}$ according to the time period when they were received. There are at most N null pointers that can be stored per class queue, and this is used to align the pointers in such a way as to represent time as described in more detail to follow. The scheduler 222 provides a read signal to the class queue controller 601 to read the data pointers from the class queues $602_{1-N}$. The data pointers are stored in the class queues and read out in a first come first serve (FCFS/FIFO) manner.

Figure 9:
FIG. 9 illustrates storage of data pointers into class queues.
Figure 9:
Figure 9:
Figure 9:

FIG. 9 illustrates how null pointers are used to indicate timing of storage of the data pointers. As shown, for a time t0 a pointer P1 is stored for class 1. A null pointer N is then stored in subsequent cycles t1-4 when no data is received. A null pointer is also provided by the controller 601 into class queues if a data error occurs as determined from the CYC check and data from a port must be discarded. This provides for a non-blocking pipeline, since otherwise once data is discarded readdressing would be needed.

Continuing with reference to FIG. 9, the pointer P3 is provided to the queue for class 2, and arrives at time t1, so null pointers N are stored at other times when no data is received for class 2. A pointer P2 is received for both t2 and t4 in class 3, but otherwise null pointers are provided by the controller 601. Pointers and null pointers are similarly provided in queues for other classes according to embodiments of the present invention. Data to be read out as determined by the scheduler 222 from a class queue can be easily located in the cell buffer 220 by the read controller 224. The dequeuing of data is done in parallel from all the class queues, i.e. on every hardware clock cycle the scheduler provides the number of pointers making up a packet.

For a random access memory where data is not striped into the memory, one would need a number to indicate the sequencing of cells. A linked list type structure would be required that would allow one to de-queue cells associated with the same packet in sequence. This would simply reassembly of data packets from the cell buffer memory segments, but the class-queue would have to store the entire link list associated with the cells belonging to a packet of a particular class. The controller would then have to dynamically manage N link lists at a minimum every switching cycle.

Although the present invention has been described above with particularity, this was merely to teach one of ordinary skill in the art how to make and use the invention. Many additional modifications will fall within the scope of the invention, as that scope is defined by the following claims.

What is claimed is:

1. A network switch comprising:
    input ports for receiving data from network nodes;
    a block memory buffer partitioned into sections;
    a write controller having inputs receiving data bursts from the input ports, the write controller for dividing the data bursts from the input ports into segments, and storing the data segments in a sequence in the sections of the memory buffer;
    a lookup and classification module for receiving the data from the input ports, decoding headers from the data bursts, providing error checking, and determining a class for the data from the headers;

a class queue for storing pointers provided from the lookup and classification module according to class as indicated by the lookup and classification module, the pointers being stored in a manner to indicate a time the data packet segment was stored in the memory;

a scheduler for determining an order of class queues where data will be read out, obtaining the pointers from the class queue, and providing an indication of next data to be read;

a read controller for reading data from the block memory buffer according to the indication of next data to be read provided from the scheduler; and output ports for receiving data from the read controller and providing the data to the network nodes.

2. The network switch of claim 1, wherein the number of input ports and the number of output ports of the network switch are programmable.

3. The network switch of claim 1, wherein the number of sections of the block memory buffer is programmable.

4. The network switch of claim 3, wherein the number of input ports equals the number of output ports.

5. The network switch of claim 4, wherein the number of sections of the block memory buffer is programmable and are a multiple of the number of input ports and output ports.

6. The network switch of claim 5, wherein the number of sections of the block memory buffer is two times the number of input ports.

7. The network switch of claim 1,
wherein the data bursts comprises packets, and
wherein the data segments are formed by dividing the packets, wherein the pointers each identify one of the packets.

8. The network switch of claim 1,
wherein the data bursts comprises packets, and
wherein the data segments are formed by dividing the packets, wherein the pointers each identify one of the packets.

9. The network switch of claim 1, wherein the scheduler comprises a round robin selection mechanism.

10. A network switch comprising:
input ports for receiving data from network nodes;
a memory partitioned into sections;
means for writing having inputs receiving data bursts from the input ports, the writing means for dividing the data bursts from the input ports into segments, and storing the data segments in a sequence in the sections of the memory buffer;

means for classifying data from the input ports for determining a class for each of the data bursts and providing a pointer for each of the data segments;

means for queuing pointers provided from the lookup and classification module according to class as indicated by the lookup and classification module, the pointers being stored in a manner to indicate a time the data packet segment was stored in the memory;

a scheduler for determining an order of class queues where data will be read out, obtaining the pointers from the queuing means, and providing an indication of next data to be read out of the memory;

means for reading to read data from the memory according to the indication of next data to be read provided from the scheduler; and output ports for receiving data from the reading means and providing the data to the network nodes.

11. The network switch of claim 10 wherein the means for queuing pointers is configured in programmable logic of a programmable logic device (PLD).

12. A network switch comprising:
a block memory buffer partitioned into sections;
a write controller having inputs receiving data bursts from input ports, the write controller for dividing the data bursts from the input ports into segments, and storing the data segments in a sequence in the sections of the memory buffer;

a lookup and classification module for receiving the data from the input ports, decoding headers from the data bursts, providing error checking, and determining a class for the data from the headers; and a class queue for storing pointers provided from the lookup and classification module according to class as indicated by the lookup and classification module, the pointers being stored in a manner to indicate a time the data packet segment was stored in the memory by the write controller.

13. The network switch of claim 12 wherein the lookup and classification module is configured using programmable logic and programmable interconnect elements.

14. The network switch of claim 12 configured in a field programmable gate array.

15. The network switch of claim 12 further comprising programmable logic and programmable interconnect elements.

* * * * *